(12) United States Patent
Lin et al.

(10) Patent No.: US 7,772,081 B2
(45) Date of Patent: Aug. 10, 2010

(54) SEMICONDUCTOR DEVICE AND METHOD OF FORMING HIGH-FREQUENCY CIRCUIT STRUCTURE AND METHOD THEREOF

(75) Inventors: Yaojian Lin, Singapore (SG); Jianmin Fang, Singapore (SG); Kang Chen, Singapore (SG); Haijing Cao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 134 days.

(21) Appl. No.: 12/212,524

(22) Filed: Sep. 17, 2008

(65) Prior Publication Data

US 2010/0065942 A1 Mar. 18, 2010

(51) Int. Cl.
*H01L 21/20* (2006.01)
*H01L 29/00* (2006.01)
(52) U.S. Cl. ............... 438/393; 257/531; 257/E29.001
(58) Field of Classification Search ............... 336/200; 438/393; 257/531, E21.09, E29.001
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 7,619,901 B2 | 11/2009 | Eichelberger et al. | |
| 7,648,911 B2 * | 1/2010 | Pagaila et al. | 438/667 |
| 2005/0023664 A1 * | 2/2005 | Chudzik et al. | 257/678 |
| 2007/0205855 A1 * | 9/2007 | Hashimoto | 336/200 |
| 2009/0302435 A1 * | 12/2009 | Pagaila et al. | 257/659 |
| 2009/0302437 A1 * | 12/2009 | Kim et al. | 257/659 |

* cited by examiner

*Primary Examiner*—David S Blum
(74) *Attorney, Agent, or Firm*—Robert D. Atkins

(57) ABSTRACT

A semiconductor device is made by providing an integrated passive device (IPD). Through-silicon vias (TSVs) are formed in the IPD. A capacitor is formed over a surface of the IPD by depositing a first metal layer over the IPD, depositing a resistive layer over the first metal layer, depositing a dielectric layer over the first metal layer, and depositing a second metal layer over the resistive and dielectric layers. The first metal layer and the resistive layer are electrically connected to form a resistor and the first metal layer forms a first inductor. A wafer supporter is mounted over the IPD using an adhesive material and a third metal layer is deposited over the IPD. The third metal layer forms a second inductor that is electrically connected to the capacitor and the resistor by the TSVs of the IPD. An interconnect structure is connected to the IPD.

18 Claims, 9 Drawing Sheets

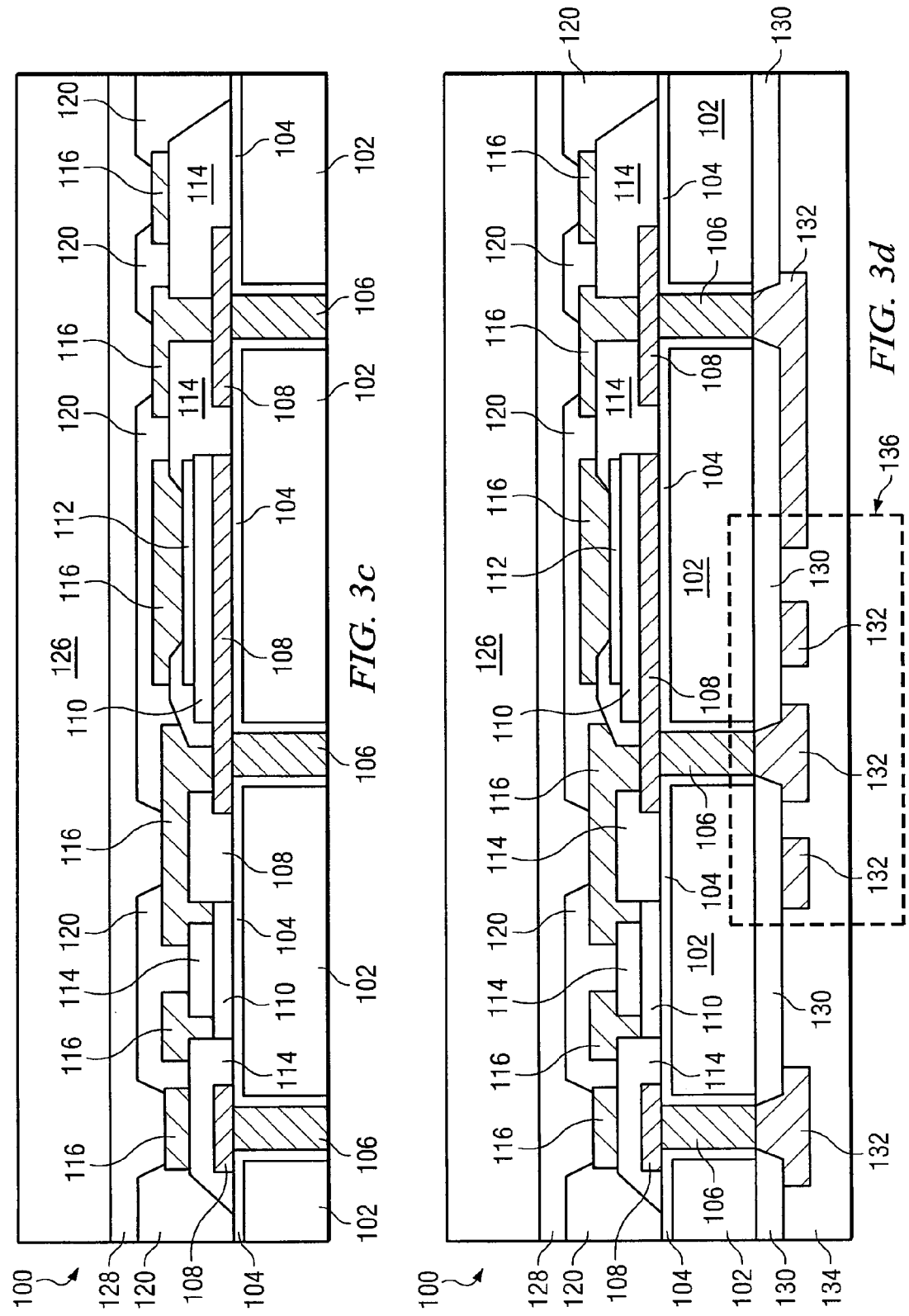

SEMICONDUCTOR DEVICE AND METHOD OF FORMING HIGH-FREQUENCY CIRCUIT STRUCTURE AND METHOD THEREOF

FIELD OF THE INVENTION

The present invention relates in general to semiconductor devices and, more particularly, to a semiconductor device having an integrated passive device (IPD) connected to an inductor and capacitor formed over the IPD.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In most applications, semiconductor devices use one or more inductors and capacitors to implement the device's filters and to provide system functionality. In some packages, the inductors and capacitors are provided as part of a prefabricated integrated passive device (IPD) that is mounted to the semiconductor device and electrically connected to the other components of the semiconductor device. Unfortunately, the two-dimensional layout of an IPD limits the capacity of capacitors and inductors formed within its substrate. In applications requiring relatively large capacitors and inductors, therefore, it is difficult to provide the necessary inductors and capacitors within the IPD itself.

SUMMARY OF THE INVENTION

In one embodiment, the present invention is a method of making a semiconductor device comprising the steps of providing an integrated passive device (IPD), forming through-silicon vias (TSVs) in the IPD, and forming a capacitor over a surface of the IPD. The capacitor is formed by depositing a first metal layer over the IPD, depositing a resistive layer over the first metal layer, depositing a dielectric layer over the first metal layer, and depositing a second metal layer over the resistive and dielectric layers. The first metal layer and the resistive layer are electrically connected to form a resistor and the first metal layer forms a first inductor. The method includes mounting a wafer supporter over the IPD using an adhesive material, and depositing a third metal layer over the IPD. The third metal layer forms a second inductor. The second inductor is electrically connected to the capacitor and the resistor by the TSVs of the IPD. The method includes connecting an interconnect structure to the IPD.

In another embodiment, the present invention is a method of making a semiconductor device comprising the steps of providing an integrated passive device (IPD) having a plurality of through-silicon vias (TSVs), and forming a capacitor over a first surface of the IPD. The capacitor is electrically connected to a TSV of the IPD. The method includes forming a resistor over the first surface of the IPD. The resistor is electrically connected to the capacitor. The method includes forming an inductor over a second surface of the IPD opposite the first surface. The inductor is electrically connected to the capacitor and the resistor by the TSVs of the IPD. The method includes connecting an interconnect structure to the IPD.

In another embodiment, the present invention is a method of making a semiconductor device comprising the steps of providing a substrate having a through substrate via, and forming a capacitor over a first surface of the substrate. The capacitor is connected to the via. The method includes forming an inductor over a second surface of the substrate opposite the first surface. The inductor is connected to the capacitor by the through substrate via.

In another embodiment, the present invention is a semiconductor device comprising an integrated passive device (IPD) having a through-silicon via (TSV), and a capacitor formed over a first surface of the IPD. The capacitor is electrically connected to the TSV of the IPD. The device includes a resistor formed over the first surface of the IPD. The resistor is electrically connected to the capacitor. The device includes an inductor formed over a second surface of the IPD opposite the first surface. The inductor is electrically connected to the capacitor and the resistor by the TSV of the IPD. The device includes an interconnect structure connected to the IPD.

BRIEF DESCRIPTION OF THE DRAWINGS

FIGS. 3a-3e illustrate a method of forming a semiconductor device having an integrated passive device (IPD) connected to an inductor and capacitor, the inductor and capacitor are formed over the IPD;

DETAILED DESCRIPTION OF THE DRAWINGS

Figure 1:
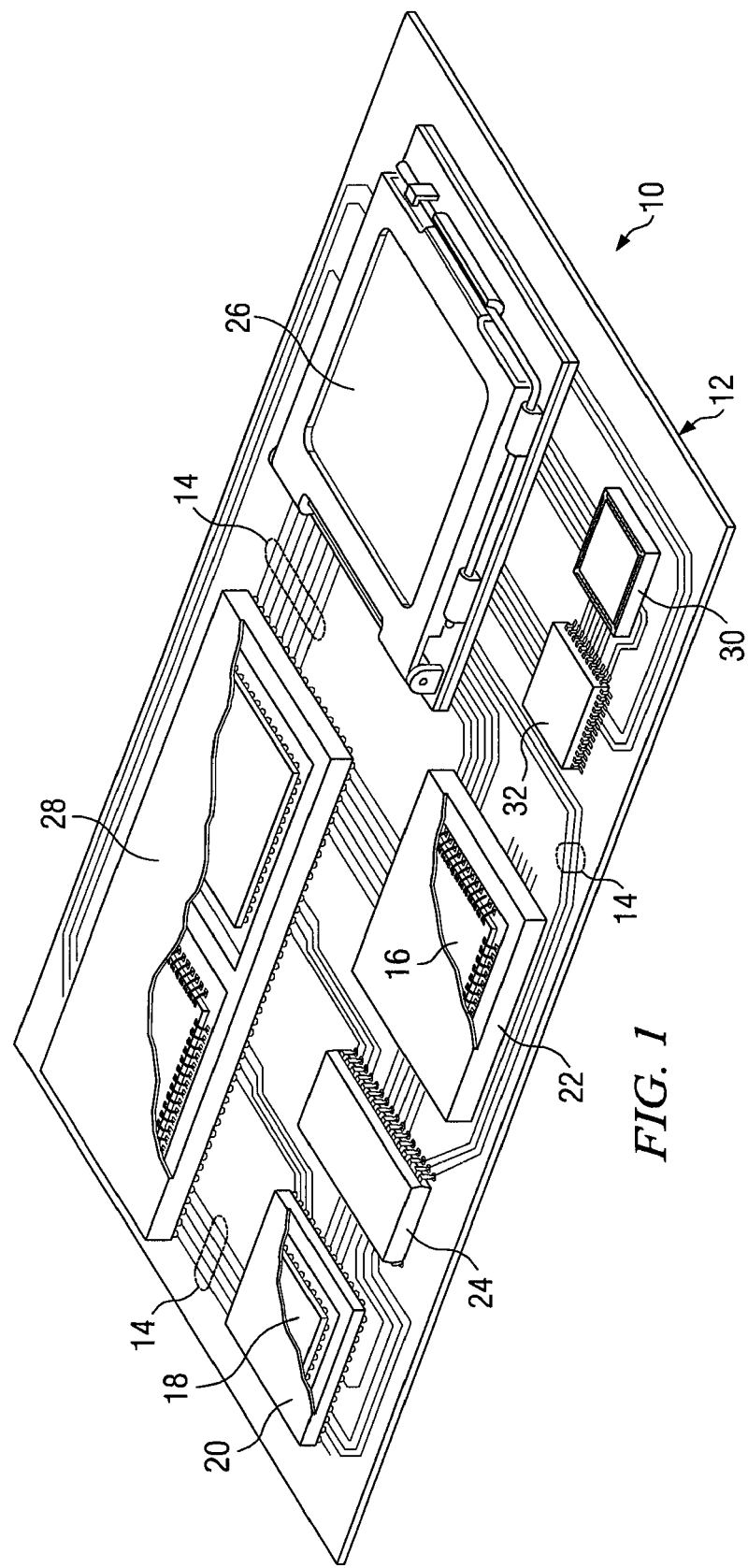
FIG. 1 illustrates a PCB with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
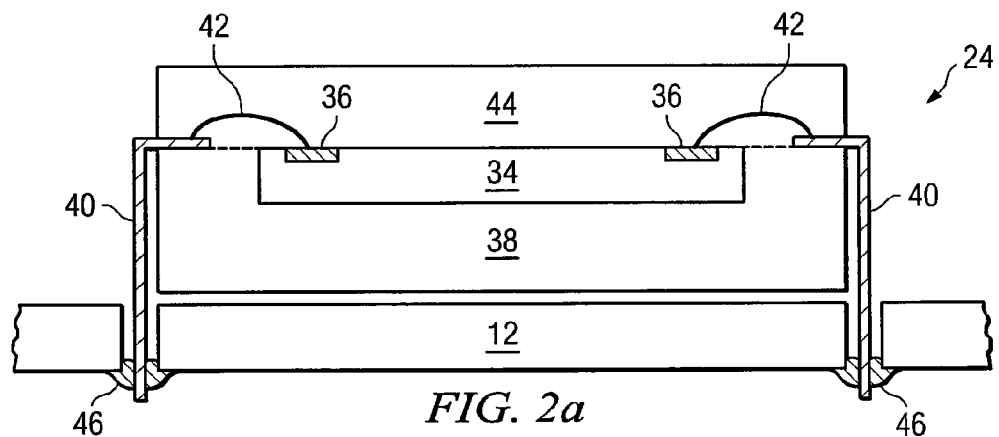
FIGS. 2a-2c illustrate further detail of the semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
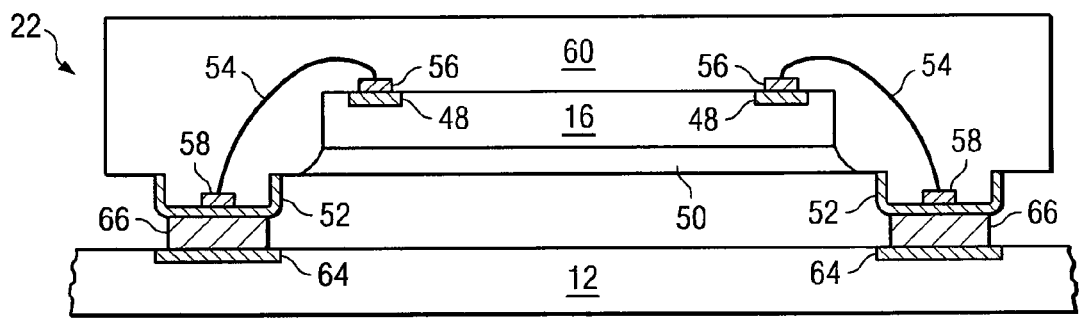

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Molding compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
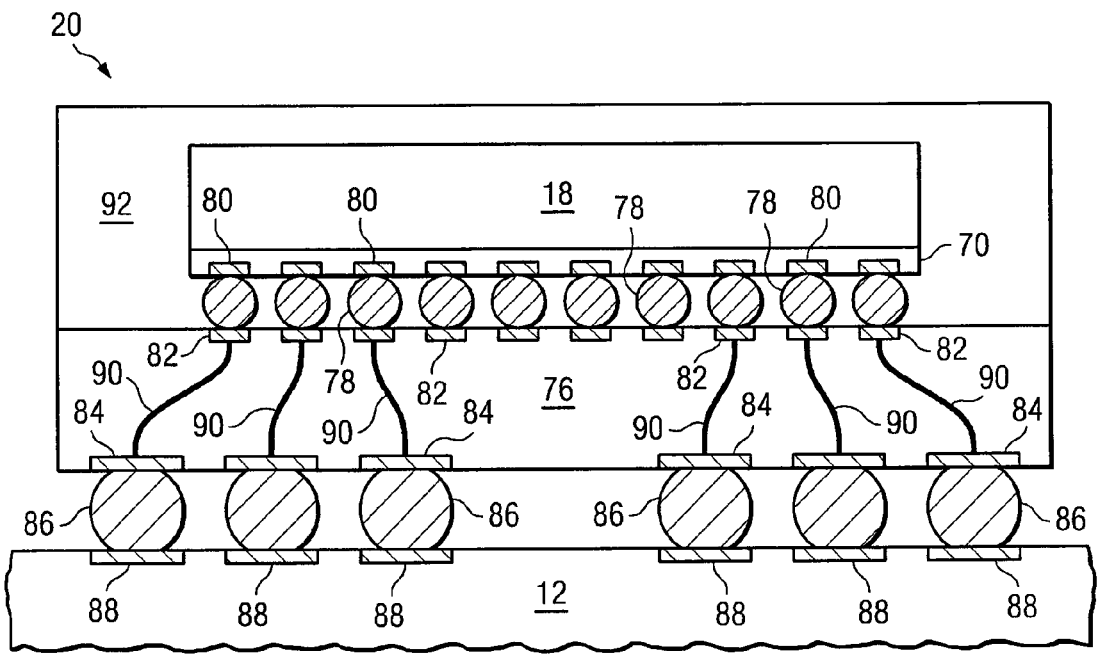

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
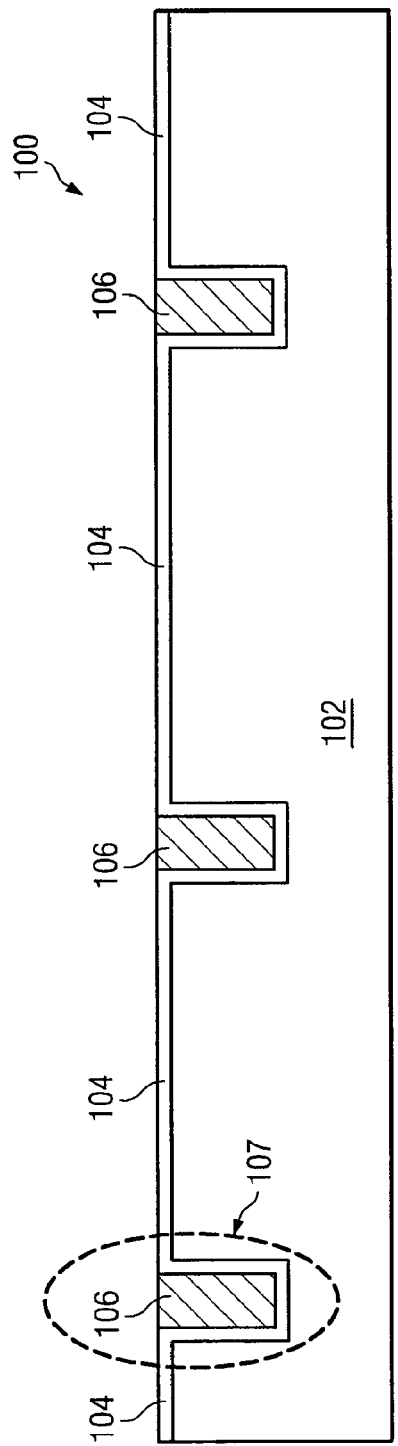

FIGS. 3a-3e illustrate a method of forming semiconductor device 100 having an integrated passive device (IPD) with connections to an inductor and capacitor, the inductor and capacitor may be formed over different surfaces or substrates of IPD 102. Turning to FIG. 3a, semiconductor substrate or high resistivity substrate 102 is first provided. The substrate of IPD 102 includes silicon (Si), other semi-conducting materials, or a high-resistivity substrate material and may include an optional pre-built circuit. An active region is formed within IPD 102 that includes one or more integrated circuits and passive or active devices used by semiconductor device 100 for implementing radio-frequency (RF), or other high-frequency applications. Vias are formed in the substrate of IPD 102 using deep reactive ion etching (DRIE), laser etching, laser drilling, or another etching process. Insulation layer 104 is formed over the substrate of IPD 102. Insulation layer 104 is typically made with silicon dioxide (SiO2), but can also be made with silicon nitride (Si3N4), silicon oxynitride (SiON), tantalum pentoxide (Ta2O5), zircon (ZrO2), aluminum oxide (Al2O3), or other material having dielectric insulation properties. The deposition of insulation layer 104 involves CVD, or thermal oxidation, for example. Insulation layer 104 is formed conformally over the substrate of IPD 102 and a conductive material is deposited into the vias to form through-silicon vias (TSVs) 106. TSVs 106 may be blind (as indicated by 107 on FIG. 3a) or may be exposed at the back-surface of the substrate of IPD 102. Conductive materials are formed in TSVs 106 using an evaporation, electrolytic plating, electroless plating, screen printing, or another suitable metal deposition process and include Al, Cu, Sn, Ni, Au, or Ag or another conductive material.

Figure 3B:
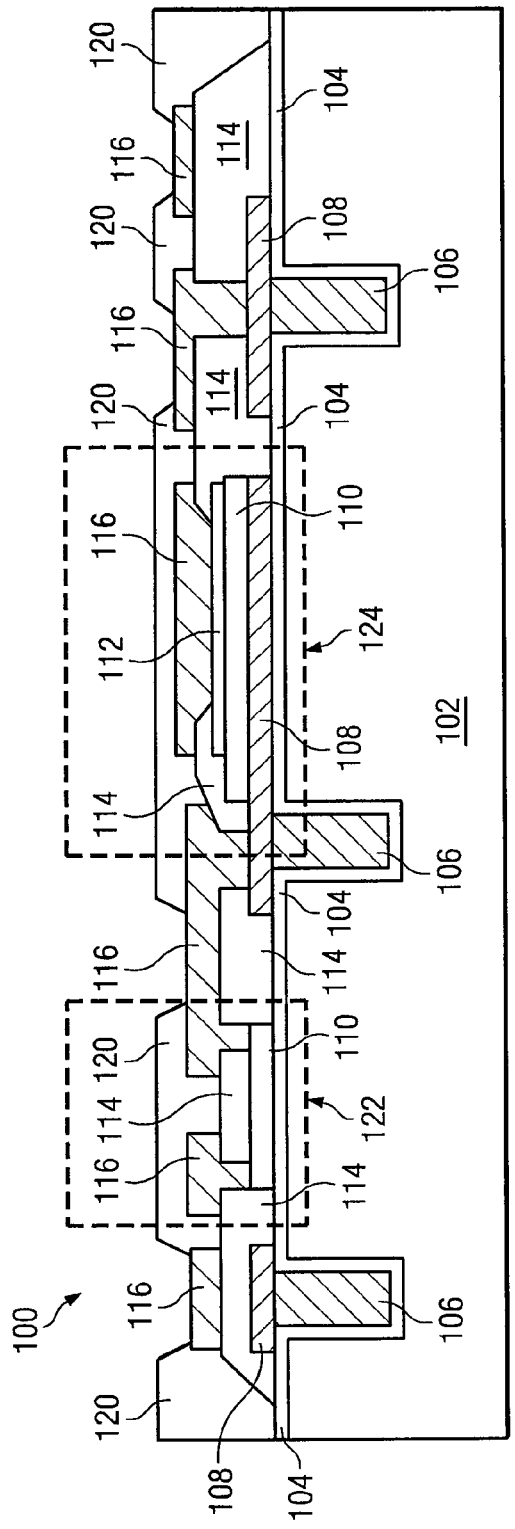

Turning to FIG. 3b, various passive devices including capacitors, resistors and inductors are formed over a surface of the substrate of IPD 102. Metal layer 108 is deposited over insulation layer 104 and is electrically connected to TSVs 106. Resistive layer 110 is deposited over metal layer 108 and insulation layer 104 and includes tantalum silicide (TaxSiy) or other metal silicides, TaN, nichrome (NiCr), TiN, or doped poly-silicon. Dielectric layer 112 is deposited over resistive layer 110. Dielectric layer 112 can be silicon nitride (Si3N4), tantalum oxide (Ta2O5), hafnium oxide (HfO2), or a dielectric film material. In the present embodiment, resistive layer 110, formed between dielectric layer 112 and metal layer 108, is optional. Insulation layer 114 is deposited over insulation layer 104, metal layer 108, resistive layer 110, and dielectric layer 112. Metal layer 116 includes a conductive material and is deposited over insulation layer 114 using a PVD, CVD, electrolytic plating, or electroless plating process.

The combination of metal, insulation, dielectric, and resistive layers forms one or more passive devices over a surface of the substrate of IPD 102. Box 122 shown on FIG. 3b indicates a resistor structure formed over the substrate of IPD 102 that includes portions of resistive layer 110 and metal layer 116. Box 124 indicates a capacitor structure formed over IPD 102 that includes portions of metal layer 108, resistive layer 110, dielectric layer 112 and metal layer 116. Portions of metal layers 108 and 116 form the electrodes of the capacitor indicated by box 124. In alternative embodiments, different combinations of passive devices, RF circuitry, or other electronic circuits are formed over the substrate of IPD 102 to provide the necessary functionality of semiconductor device 100. Insulation layer 120 is deposited over the substrate of IPD 102 to provide electrical isolation and physical protection to semiconductor device 100. Insulation layer 120 is patterned to expose portions of metal layer 116.

Turning to FIG. 3c, temporary wafer carrier 126 is mounted over device 100 using adhesion layer 128. Temporary wafer carrier 126 includes a stiff material such as a glass wafer or flexible tape substrate and facilitates the build-up process performed over the back-surface of the substrate of IPD 102. Temporary wafer carrier 126 can also include certain flexible tapes, such as high temperature back grinding tape, to support the wafer. Adhesion layer 128 is deposited using spin coating, or printing, and may include a laminated polymer adhesive or an ultra-violet (UV) curable liquid adhesive. In one embodiment, adhesion layer 128 is light, heat or mechanically releasable. After mounting temporary wafer carrier 126, a backgrinding process is used to remove a portion of IPD 102 to expose conductive TSVs 106. The backgrinding process may involve mechanical griding, chemical-mechanical polishing (CMP), wet etching, or plasma etching. After backgrinding, the metal in TSVs 106 is exposed.

Turning to FIG. 3d, additional conductive and insulation layers are formed over a back-surface of the substrate of IPD 102. For example, insulation layer 130 is deposited over IPD 102. Insulation layer 130 is patterned to expose TSVs 106 of the substrate of IPD 102. Metal layer 132 is deposited and patterned over insulation layer 130. Metal layer 132 is electrically connected to TSVs 106. Using TSVs 106, metal layer 132 is also connected to the resistor, capacitor, and other circuit elements formed over the back-surface of IPD 102. Insulation layer 134 is deposited over metal layer 132 to provide electrical isolation and mechanical support to semiconductor device 100. Insulation layer 134 may be deposited using spin coating, printing, lamination or molding, for example. As shown in FIG. 3d, metal layer 132 is patterned such that a portion of metal layer 132 forms an inductor structure indicated by box 136. In alternative embodiments, additional metal, dielectric, or insulation layers may be formed over the substrate of IPD 102 to form additional passive circuit elements over a back-surface of IPD 102.

Figure 3E:
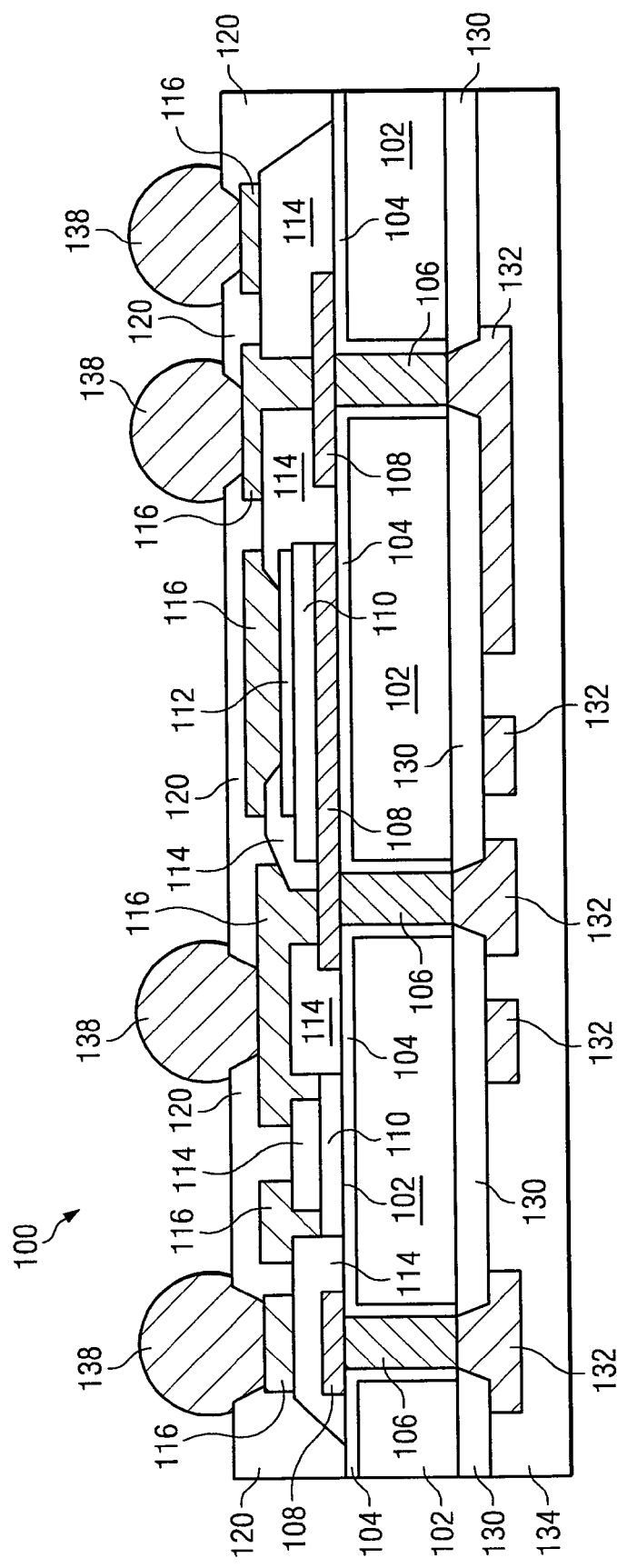

Turning to FIG. 3e, temporary wafer carrier 126 and adhesion layer 128 are removed and an interconnect structure is connected to device 100. As shown in FIG. 3e, the interconnect structure includes solder bumps 138 deposited over insulation layer 120 and electrically connected to metal layer 116. Bumps 138 include an electrically conductive material such as solder or other electrically conductive material, e.g., Sn, Pb, Au, Ag, Cu, Zn, Bi, and alloys thereof. For example, the solder material can be eutectic Sn/Pb, high lead, or lead free. The solder material is deposited over the patterned regions of insulation layer 120 and is reflowed to form bumps 138. In alternative embodiments, other interconnect structures such as stud bumping, wirebonds or conductive pillars are connected to semiconductor device 100 to allow for the connection of external system components.

Using the above method, a semiconductor device is formed that includes passive circuit elements formed over the surfaces of a semiconductor substrate. In one embodiment, the semiconductor substrate includes an IPD that provides integrated circuits and functionality for RF, or other high-frequency applications. As described above, a capacitor is formed over a first surface of the IPD, while an inductor is formed over the opposite surface of the IPD. By forming the capacitor opposite the inductor on the opposing surface of the substrate, larger capacitance values can be integrated with an inductor using a shorter connection path. The capacitor may also be formed vertically over a central region of the inductor. The dimensions of the capacitor are not limited by those of the inductor as when trying to form a capacitor at the center of the inductor. By forming the capacitor and inductor over opposing surfaces of the substrate, the dimensions of the IPD can be minimized while maintaining system performance and providing more design capability. The passive circuit elements are formed in an IPD and are connected with each other using 2D and 3D interconnections. A plurality of TSVs are formed within the substrate of the IPD. The TSVs allow for the formation of integrated circuits that interconnect the IPD with more flexibility and greater functionality.

Figure 4:
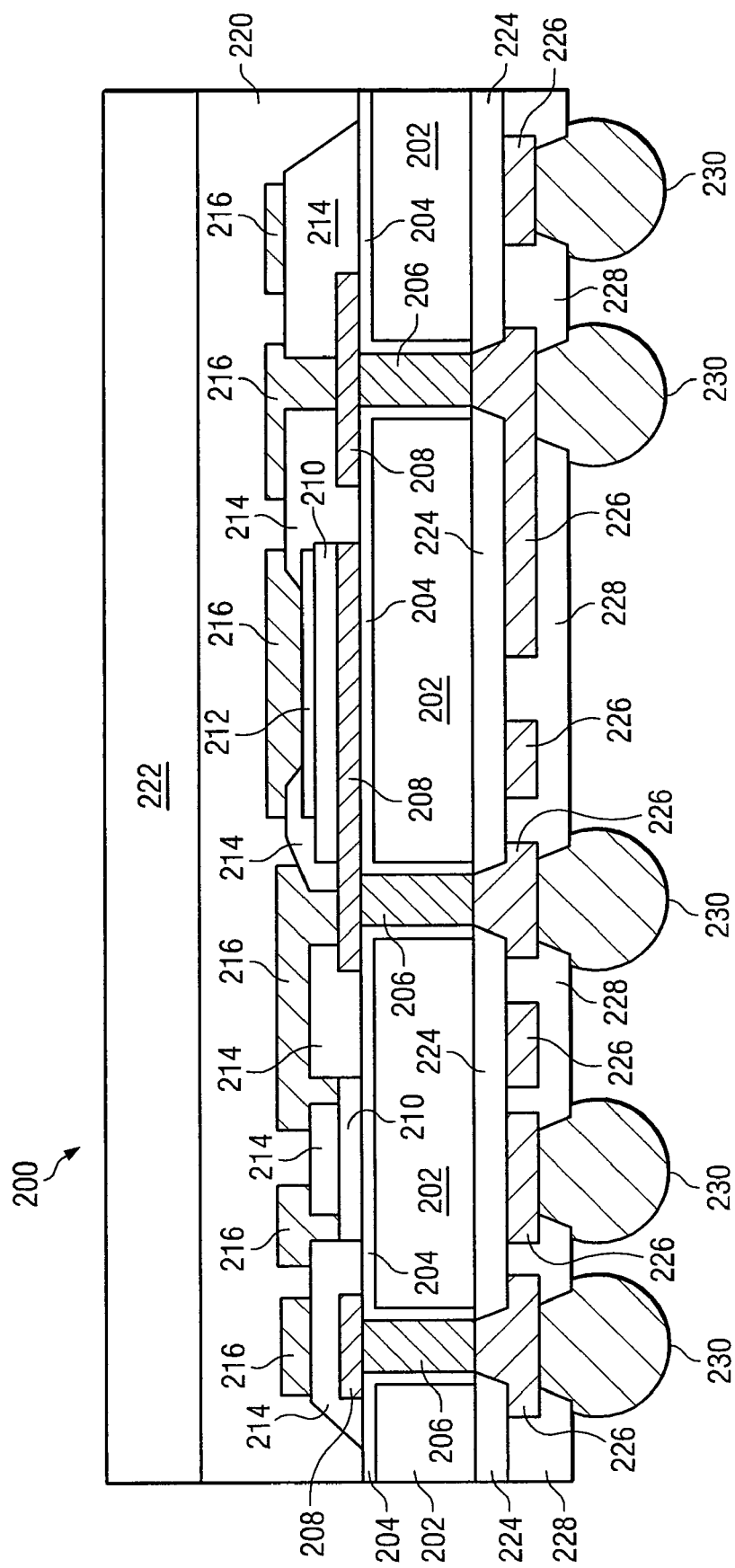
FIG. 4 illustrates a semiconductor device having an IPD connected to an inductor and capacitor, an interconnect structure is formed over the inductor.

FIG. 4 illustrates semiconductor device 200 having an IPD connecting an inductor, resistor, and capacitor, an interconnect structure is formed over the inductor. The substrate of IPD 202 includes Si, other semi-conducting materials, or a high-resistivity substrate material. The substrate of IPD 202 may include an optional prebuilt circuit. An active region is formed over the substrate of IPD 202 that includes one or more integrated circuits and passive or active devices used by semiconductor device 200. Vias are formed in the substrate of IPD 202 using DRIE, laser etching, laser drilling, or another etching process. Insulation layer 204 is formed over the substrate of IPD 202 and includes a material having dielectric insulation properties. The deposition of insulation layer 204 involves PVD, CVD, printing, sintering, or thermal oxidation, for example. Insulation layer 204 is formed conformally over the substrate of IPD 202 and a conductive material is deposited into the vias to form TSVs 206. In one embodiment, TSVs 206 are exposed by backgrinding of the substrate of IPD 202. The conductive materials of TSVs 206 are formed using an evaporation, electrolytic plating, electroless plating, screen printing, or another suitable metal deposition process and include Al, Cu, Sn, Ni, Au, or Ag or another conductive material.

Metal layer 208 is deposited over insulation layer 204 and is electrically connected to TSVs 206. Resistive layer 210 is deposited over metal layer 208 and insulation layer 204 and includes TaxSiy or other metal silicides, TaN, NiCr, TiN, or doped poly-silicon. Dielectric layer 212 is deposited over resistive layer 210. Dielectric layer 212 can be Si3N4, SiON, Ta2O5, HfO2, or a dielectric film material. Insulation layer 214 is deposited over insulation layer 204, metal layer 208, resistive layer 210, and dielectric layer 212. Metal layer 216 includes a conductive material and is deposited over insulation layer 214 using a PVD, CVD, electrolytic plating, or electroless plating process. The combination of metal, insulation, dielectric, and resistive layers forms one or more passive devices over a surface of IPD 202. By patterning each layer, various resistors, inductors, or capacitors are formed over a surface of IPD 202.

Encapsulant 220, such as a molding compound, is deposited over metal layer 216 to provide electrical isolation and physical support to semiconductor device 200. Molding compound 220 includes epoxy acrylate or other polymer material with or without filler, and is applied by paste printing, compressive molding, or other molding processes. In an alternative embodiment, however, molding compound 220 is replaced by a permanently bonding adhesive material. An optional mechanical carrier 222 is mounted to adhesive material 220 to provide additional physical support to device 200. Mechanical carrier 222 may include a conductive layer to provide electro-magnetic interference (EMI) protection to device 200. Similarly, mechanical carrier 222 may include heat sinks, thermal sheets, or heat spreaders to facilitate the removal of thermal energy from device 200.

Insulation layer 224 is deposited over a back side of IPD 202. Insulation layer 224 is patterned to expose TSVs 206 of IPD 202. Metal layer 226 is deposited and patterned over insulation layer 224. Metal layer 226 is electrically connected to TSVs 206. Using TSVs 206, metal layer 226 is also connected to the resistor, capacitor, and other circuit elements formed over the back-surface of IPD 202. Insulation layer 228 is deposited over metal layer 226 to provide electrical isolation and mechanical support to semiconductor device 200. Insulation layer 228 may be deposited using spin coating, printing, lamination or molding, for example. Metal layer 226 forms an inductor structure over the back surface of IPD 202. In alternative embodiments, additional metal, dielectric, or insulation layers may be deposited over IPD 202 to form additional passive circuit elements.

An interconnect structure is connected to device 200. As shown in FIG. 4, the interconnect structure includes solder bumps 230 deposited over insulation layer 228 and electrically connected to metal layer 226. Bumps 230 include an electrically conductive material such as solder. The conductive material is deposited over the patterned regions of insulation layer 228 and is reflowed to form bumps 230. In alternative embodiments, other interconnect structures such as stud bumping, wirebonds or conductive pillars are connected to semiconductor device 200 to allow for the connection of external system components.

Figure 5:
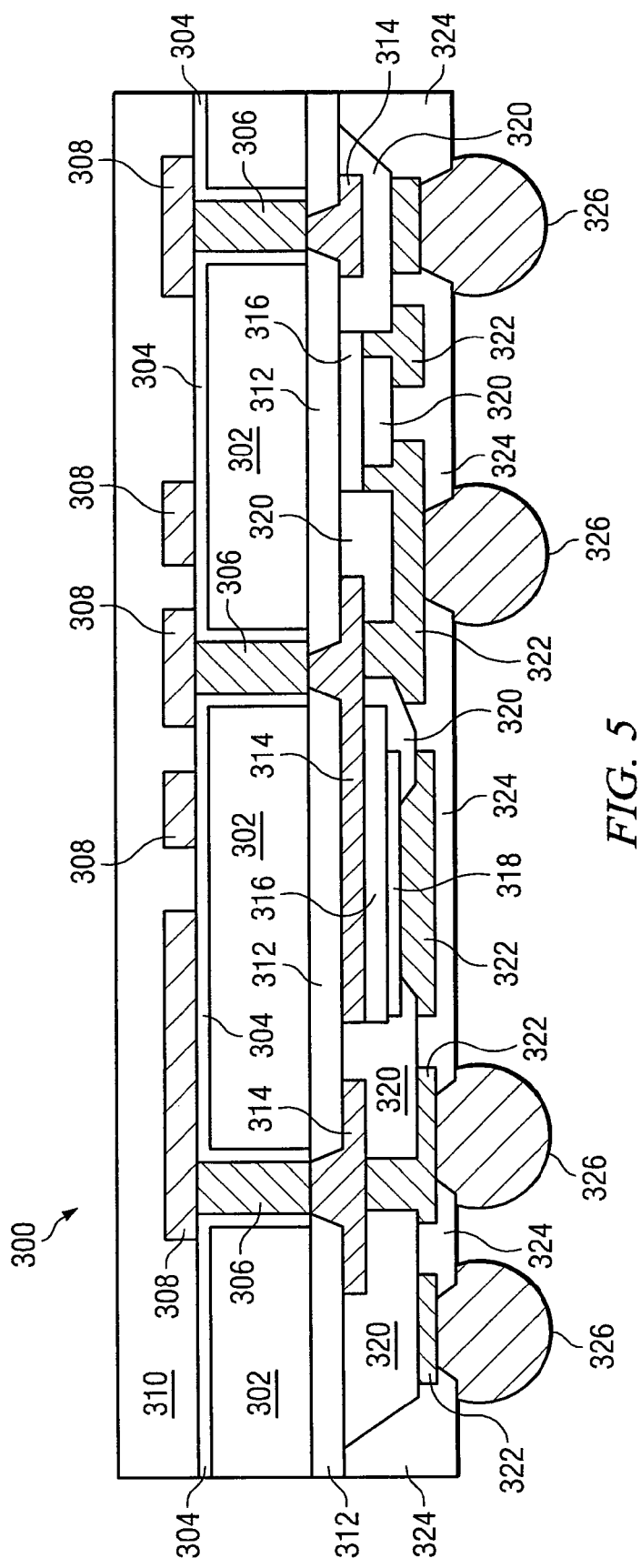
FIG. 5 illustrates a semiconductor device having an IPD connected to an inductor and capacitor, an inductor structure is formed over a back-surface of the IPD.

FIG. 5 illustrates semiconductor device 300 having an IPD connected to an inductor and capacitor, an inductor structure is formed over a front-surface of the IPD. The substrate of IPD 302 includes Si, other semi-conducting materials, or a high-resistivity substrate material. The substrate of IPD 302 may include an optional prebuilt circuit. An active region is formed over the substrate of IPD 302 that includes one or more integrated circuits and passive or active devices used by semiconductor device 300. Vias are formed in IPD 302 using laser etching, laser drilling, or another etching process. Insulation layer 304 is formed over IPD 302 and includes a material having dielectric insulation properties. The deposition of insulation layer 304 involves PVD, CVD, printing, sintering, or thermal oxidation, for example. Insulation layer 304 is formed conformally over IPD 302 and a conductive material is deposited into the vias to form TSVs 306. In one embodiment, TSVs 306 are exposed by backgrinding of IPD 302. The conductive material of TSVs 306 is formed using an evaporation, electrolytic plating, electroless plating, screen printing, or another suitable metal deposition process and include Al, Cu, Sn, Ni, Au, or Ag or another conductive material.

Metal layer 308 is deposited over insulation layer 304 and is electrically connected to TSVs 306. As shown in FIG. 5, metal layer 308 is patterned to form an inductor structure over the top surface of IPD 302. The inductor is connected to TSVs 306 of IPD 302. Insulation layer 310 is formed over metal layer 308 to provide electrical insulation and mechanical support for semiconductor device 300. Insulation layer 310 is deposited using spin coating, printing, or molding, for example. In an alternative embodiment, additional resistive layers are formed over the top surface of IPD 302 to form a resistor structure connected to metal layer 308.

Insulation layer 312 is deposited over a back surface of IPD 302. Insulation layer 312 is patterned to expose TSVs 306 of IPD 302. Metal layer 314 is deposited and patterned over insulation layer 312. Metal layer 314 is electrically connected to TSVs 306. Using TSVs 306, metal layer 314 is also connected to the inductor structure and other circuitry formed over IPD 302 by metal layer 308. Resistive layer 316 is deposited over metal layer 314 and insulation layer 312 and includes TaxSiy or other metal silicides, TaN, NiCr, TiN, or doped poly-silicon. Dielectric layer 318 is deposited over resistive layer 316. Dielectric layer 318 can be Si3N4, Ta2O5, HfO2, or a dielectric film material. Insulation layer 320 is deposited over insulation layer 312, metal layer 314, resistive layer 316, and dielectric layer 318. Metal layer 322 includes a conductive material and is deposited over insulation layer 320 using a PVD, CVD, electrolytic plating, or electroless plating process. The combination of metal, insulation, dielectric, and resistive layers forms one or more passive devices over a surface of IPD 302. By patterning each layer, various resistors, inductors, or capacitors are formed over a surface of IPD 302. Insulation layer 324 is deposited over metal layer 322. Insulation layer 324 provides electrical insulation and mechanical support to device 300 and is patterned to expose portions of metal layer 322. Insulation layer 324 may be deposited using spin coating, printing, lamination or molding, for example.

An interconnect structure is connected to device 300. As shown in FIG. 5, the interconnect structure includes solder bumps 326 deposited over insulation layer 324 and electrically connected to metal layer 322. Bumps 326 include an electrically conductive material such as solder. The conductive material is deposited over the patterned regions of insulation layer 324 and is reflowed to form bumps 326. In alternative embodiments, other interconnect structures such as stud bumping, wirebonds or conductive pillars are connected to semiconductor device 300 to allow for the connection of external system components.

Figure 6:
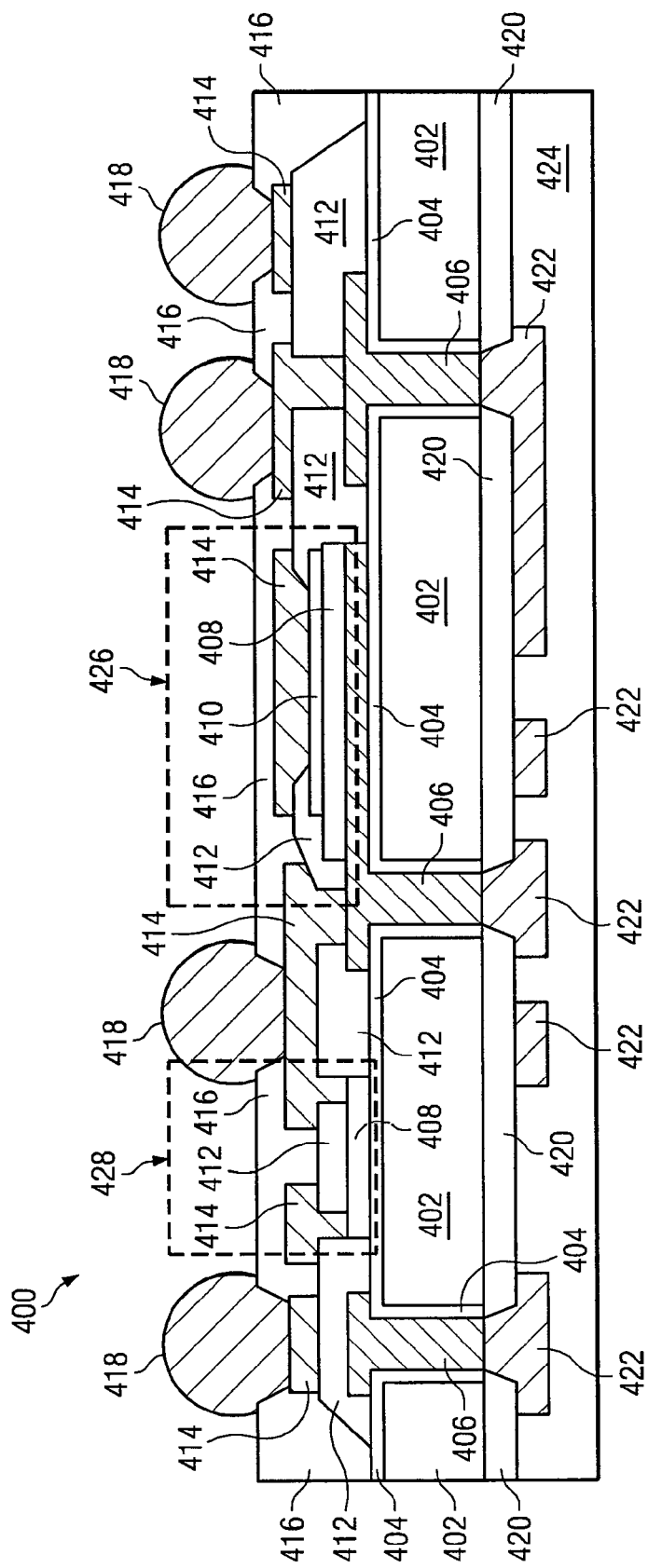
FIG. 6 illustrates a semiconductor device having an IPD connected to an inductor and capacitor, TSVS of the IPD are formed together with a bottom electrode of the capacitor.

FIG. 6 illustrates semiconductor device 400 having an IPD connected to an inductor and capacitor, the metal in TSVs of the IPD is formed together with a bottom electrode of the capacitor. The substrate of IPD 402 includes Si, other semi-conducting materials, or a high-resistivity substrate material. An active region is formed over IPD 402 that includes one or more integrated circuits and passive or active devices used by semiconductor device 400. Vias are formed in IPD 402 using DRIE, laser etching, laser drilling, or another etching process. Insulation layer 404 is formed over IPD 402. The deposition of insulation layer 404 involves PVD, CVD, printing, sintering, or thermal oxidation, for example. Insulation layer 404 is formed conformally over IPD 402. Metal layer 406 is deposited over insulation layer 404 and fills in the vias to form conductive TSVs in IPD 402. Additional CMP processes may be applied to smooth the top surface of metal 406. Resistive layer 408 is deposited over metal layer 406 and insulation layer 404 and includes TaxSiy or other metal silicides, TaN, NiCr, TiN, or doped poly-silicon. In one embodiment, the seed layer etching for plating metal layer 406 is performed after the patterning of resistive layer 408 is complete. Dielectric layer 410 is deposited over resistive layer 408. Dielectric layer 410 can be Si3N4, Ta2O5, HfO2, or a dielectric film material. Insulation layer 412 is deposited over insulation layer 404, metal layer 406, resistive layer 408, and dielectric layer 410. Metal layer 414 includes a conductive material and is deposited over insulation layer 412 using a PVD, CVD, electrolytic plating, or electroless plating process.

The combination of metal, insulation, dielectric, and resistive layers forms one or more passive devices over a surface of IPD 402. A capacitor is formed over IPD 402 (indicated by box 426). One electrode of capacitor 426 is formed by a portion of metal layer 406. Box 428 indicates a resistor structure formed over IPD 402 that includes portions of resistive layer 408 and metal layer 414. In alternative embodiments, different combinations of passive devices, RF circuitry, or other electronic circuits are formed over IPD 402 to provide the necessary functionality of semiconductor device 400. Insulation layer 416 is deposited over IPD 402 to provide electrical isolation and physical protection to semiconductor device 400.

Additional conductive and insulation layers are formed over a back-surface of IPD 402. Insulation layer 420 is deposited over IPD 402. Insulation layer 420 is patterned to expose TSVs 406 of IPD 402. Metal layer 422 is deposited and patterned over insulation layer 420. Metal layer 422 is electrically connected to TSVs 406. Using TSVs 406, metal layer 422 is connected to the resistor and capacitor structures formed over the back-surface of IPD 402. Insulation layer 424 is deposited over metal layer 422 to provide electrical isolation and mechanical support to semiconductor device 400. Insulation layer 424 may be deposited using spin coating, printing, lamination or molding, for example.

An interconnect structure is connected to device 400. As shown in FIG. 6, the interconnect structure includes solder bumps 418 deposited over insulation layer 416 and electrically connected to metal layer 414. Bumps 418 include an electrically conductive material that is deposited over the patterned regions of insulation layer 416 and reflowed to form bumps 418. In alternative embodiments, other interconnect structures such as stud bumping, wirebonds or conductive pillars are connected to semiconductor device 400 to allow for the connection of external system components.

Figure 7:
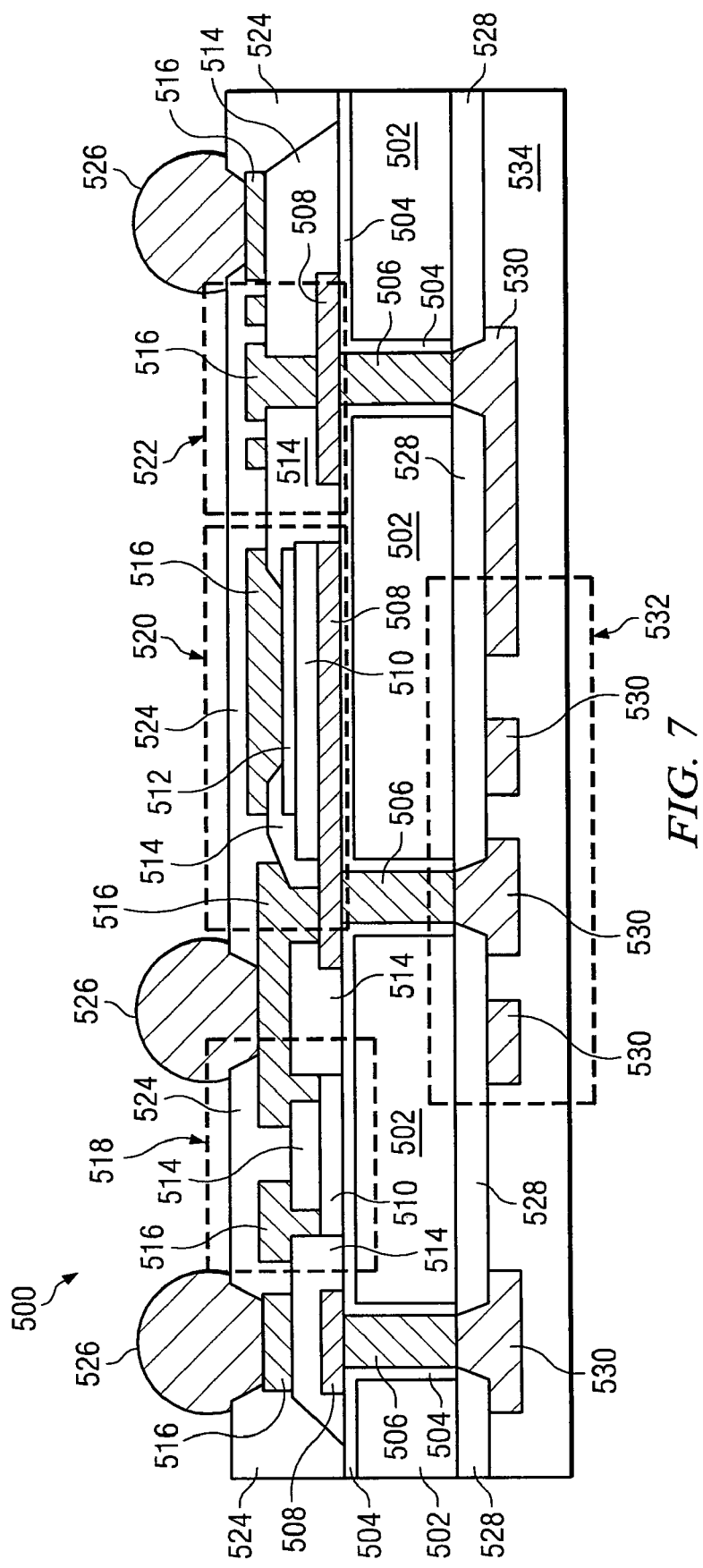
FIG. 7 illustrates a semiconductor device having an IPD connected to an inductor and capacitor, the inductor and capacitor are formed over the IPD, a second inductor is formed over a top surface of the IPD.

FIG. 7 illustrates semiconductor device 500 having an IPD connected to an inductor and capacitor, the inductor and capacitor are formed over the IPD, a second inductor is formed over a top surface of the IPD. IPD 502 includes Si, other semi-conducting materials, or a high-resistivity substrate material. An active region is formed over IPD 502 that includes one or more integrated circuits and passive or active devices used by semiconductor device 500. Vias are formed in IPD 502 using laser etching, laser drilling, or another etching process. Insulation layer 504 is formed over IPD 502. Insulation layer 504 is typically made with SiO2, but can also be made with Si3N4, SiON, Ta2O5, ZrO2, Al2O3, or other material having dielectric insulation properties. The deposition of insulation layer 504 involves PVD, CVD, printing, sintering, or thermal oxidation, for example. Insulation layer 504 is formed conformally over IPD 502 and a conductive material is deposited into the vias to form TSVs 506.

Metal layer 508 is deposited over insulation layer 504 and is electrically connected to TSVs 506. Resistive layer 510 is deposited over metal layer 508 and insulation layer 504 and includes TaxSiy or other metal silicides, TaN, NiCr, TiN, or doped poly-silicon. Dielectric layer 512 is deposited over resistive layer 510. Dielectric layer 512 can be SiN, Ta2O5, HfO2, or a dielectric film material. Insulation layer 514 is deposited over insulation layer 504, metal layer 508, resistive layer 510, and dielectric layer 512. Metal layer 516 includes a conductive material and is deposited over insulation layer 514 using a PVD, CVD, electrolytic plating, or electroless plating process.

The combination of metal, insulation, dielectric, and resistive layers forms one or more passive devices over a surface of IPD 502. Box 518 shown on FIG. 7 indicates a resistor structure formed over IPD 502 that includes portions of resistive layer 510 and metal layer 516. Box 520 indicates a capacitor structure formed over IPD 502 that includes portions of metal layer 508, resistive layer 510, dielectric layer 512 and metal layer 516. Portions of metal layers 508 and 516 form the electrodes of the capacitor indicated by box 520. Box 522 indicates an inductor structure formed by portions of metal layer 516. In alternative embodiments, different combinations of passive devices, RF circuitry, or other electronic circuits are formed over IPD 502 to provide the necessary functionality of semiconductor device 500. Insulation layer 524 is deposited over IPD 502 to provide electrical isolation and physical protection to semiconductor device 500.

Additional conductive and insulation layers are formed over a back-surface of IPD 502. Insulation layer 528 is deposited over IPD 502. Insulation layer 528 is patterned to expose TSVs 506 of IPD 502. Metal layer 530 is deposited and patterned over insulation layer 528. Metal layer 530 is electrically connected to TSVs 506. Using TSVs 506, metal layer 530 is also connected to the resistor, capacitor, inductor and other circuit elements formed over the back-surface of IPD 502. Insulation layer 534 is deposited over metal layer 530 to provide electrical isolation and mechanical support to semiconductor device 500. Insulation layer 534 may be deposited using spin coating, printing, lamination or molding, for example. As shown in FIG. 7, metal layer 530 is patterned such that a portion of metal layer 530 forms an inductor structure indicated by box 532. In alternative embodiments, additional metal, dielectric, or insulation layers may be formed over IPD 502 to form additional passive circuit elements over a back-surface of IPD 502.

An interconnect structure is connected to device 500. As shown in FIG. 7, the interconnect structure includes solder bumps 526 deposited over insulation layer 524 and electrically connected to metal layer 516. Bumps 526 include an electrically conductive material deposited over the patterned regions of insulation layer 524 and reflowed to form bumps 526. In alternative embodiments, other interconnect structures such as stud bumping, wirebonds or conductive pillars are connected to semiconductor device 500 to allow for the connection of external system components.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing an integrated passive device (IPD);
   forming through-silicon vias (TSVs) in the IPD;
   forming a capacitor over a surface of the IPD by,
      depositing a first metal layer over the IPD,
      depositing a resistive layer over the first metal layer,
      depositing a dielectric layer over the first metal layer, and
      depositing a second metal layer over the resistive and dielectric layers, wherein the first metal layer and the resistive layer are electrically connected to form a resistor and the first metal layer forms a first inductor;
   mounting a wafer supporter over the IPD using an adhesive material;
   depositing a third metal layer over the IPD, the third metal layer forming a second inductor, the second inductor being electrically connected to the capacitor and the resistor by the TSVs of the IPD; and
   connecting an interconnect structure to the IPD.

2. The method of claim 1, including backgrinding a surface of the IPD to expose the TSVs by mechanical grinding, chemical-mechanical polishing (CMP), wet etching, or plasma etching.

3. The method of claim 1, wherein the wafer supporter includes a wafer carrier, the wafer carrier having an adhesive layer or an encapsulant layer.

4. The method of claim 3, wherein the adhesive layer is deposited using spin coating, lamination, or printing and includes a heat or an ultra-violet (UV) releasable adhesive.

5. The method of claim 3, wherein the encapsulant layer is deposited by molding, printing, or lamination.

6. The method of claim 1, wherein the wafer supporter includes a conductive material to provide electromagnetic interference (EMI) protection to the semiconductor device, or a heat sink.

7. The method of claim 1, wherein the step of forming TSVs in the IPD and the step of depositing the first metal layer over the IPD are performed concurrently.

8. A method of making a semiconductor device, comprising:
   providing an integrated passive device (IPD) having a plurality of through-silicon vias (TSVs);
   forming a capacitor over a first surface of the IPD, the capacitor being electrically connected to a TSV of the IPD;
   forming a resistor over the first surface of the IPD, the resistor being electrically connected to the capacitor;
   forming an inductor over a second surface of the IPD opposite the first surface, the inductor being electrically connected to the capacitor and the resistor by the TSVs of the IPD; and
   connecting an interconnect structure to the IPD.

9. The method of claim 8, wherein forming a capacitor over a first surface of the IPD includes:
   depositing a first metal layer over the IPD;
   depositing a resistive layer over the first metal layer;
   depositing a dielectric layer over the first metal layer; and
   depositing a second metal layer over the resistive and dielectric layers, wherein the first metal layer and the resistive layer are electrically connected to form the resistor.

10. The method of claim 8, including backgrinding a surface of the IPD to expose the TSVs by mechanical grinding, chemical-mechanical polishing (CMP), wet etching, or plasma etching.

11. The method of claim 8, including mounting a temporary wafer carrier over the IPD using an adhesive material.

12. The method of claim 11, wherein the wafer carrier includes a conductive wafer, insulation wafer, or polymer tape.

13. The method of claim 8, wherein the interconnect structure includes a plurality of solder bumps.

14. A semiconductor device, comprising:
   an integrated passive device (IPD) having a through-silicon via (TSV);
   a capacitor formed over a first surface of the IPD, the capacitor being electrically connected to the TSV of the IPD;
   a resistor formed over the first surface of the IPD, the resistor being electrically connected to the capacitor;

an inductor formed over a second surface of the IPD opposite the first surface, the inductor being electrically connected to the capacitor and the resistor by the TSV of the IPD; and
an interconnect structure connected to the IPD.

15. The semiconductor device of claim 14, wherein the capacitor includes:
a first metal layer deposited over the IPD,
a resistive layer deposited over the first metal layer,
a dielectric layer deposited over the first metal layer, and
a second metal layer deposited over the resistive and dielectric layers, wherein the first metal layer and the resistive layer are electrically connected to form the resistor.

16. The semiconductor device of claim 14, including a wafer carrier mounted over the IPD using an adhesive material.

17. The semiconductor device of claim 16, wherein the wafer carrier includes a conductive material formed over an exposed surface of the wafer carrier to provide electromagnetic interference (EMI) protection to the semiconductor device.

18. The semiconductor device of claim 16, wherein the wafer carrier includes a heat sink, thermal sheet, or heat spreader.

* * * * *